(12) United States Patent
Shim et al.

(10) Patent No.: US 9,627,654 B2
(45) Date of Patent: Apr. 18, 2017

(54) ORGANIC LIGHT EMITTING DIODE DEVICE

(71) Applicant: Samsung Display Co., Ltd., Yongin (KR)

(72) Inventors: Hong Shik Shim, Seoul (KR); Chul Ho Jeong, Hwaseong-si (KR); Jae Ik Lim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/736,733

(22) Filed: Jun. 11, 2015

(65) Prior Publication Data

US 2016/0087018 A1    Mar. 24, 2016

(30) Foreign Application Priority Data

Sep. 19, 2014 (KR) .................. 10-2014-0124806

(51) Int. Cl.
*H01L 27/32* (2006.01)
*H01L 51/52* (2006.01)

(52) U.S. Cl.
CPC ...... *H01L 51/5284* (2013.01); *H01L 51/5275* (2013.01)

(58) Field of Classification Search
CPC ............... H01L 51/52; H01L 27/14627; H01L 27/3248; H01L 51/5284
See application file for complete search history.

(56) References Cited

U.S. PATENT DOCUMENTS

| 2003/0230972 | A1 | 12/2003 | Cok |
| 2010/0014313 | A1* | 1/2010 | Tillin ............... G02B 27/0101 362/606 |
| 2011/0233570 | A1 | 9/2011 | Lee et al. |
| 2015/0090982 | A1* | 4/2015 | Lin ..................... H01L 51/525 257/40 |

FOREIGN PATENT DOCUMENTS

| KR | 10-2007-0052625 | 5/2007 |
| KR | 10-2010-0030982 | 3/2010 |
| KR | 10-2011-0106733 | 9/2011 |
| KR | 10-2013-0120862 | 11/2013 |

* cited by examiner

*Primary Examiner* — Phuc Dang
(74) *Attorney, Agent, or Firm* — H.C. Park & Associates, PLC

(57) ABSTRACT

An OLED display includes a first substrate, a first electrode on the first substrate, a pixel defining layer having a first aperture exposing the first electrode, an organic light emitting layer on the first electrode, a second electrode on the organic light emitting layer, a second substrate disposed to face the first substrate, a black matrix disposed on the second substrate and having a second aperture, and a lens disposed to cover at least a part of the second aperture and protruding toward the first substrate.

19 Claims, 8 Drawing Sheets

\* 300 : 302, 304

ORGANIC LIGHT EMITTING DIODE DEVICE

CROSS REFERENCE TO RELATED APPLICATION

This application claims priority from and the benefit of Korean Patent Application No. 10-2014-0124806, filed on Sep. 19, 2014, which is hereby incorporated by reference for all purposes as if fully set forth herein.

BACKGROUND

Field

Exemplary embodiments of the present invention relate to an organic light emitting diode display having improved viewing angle and light efficiency.

Discussion of the Background

An organic light emitting diode (OLED) display device is a self-emission-type display device that displays an image with an OLED that emits light. Unlike a traditional liquid crystal display (LCD), the OLED display may not require a separate light source, and thus, may have a reduced thickness and weight when compared to the traditional LCD. Further, the OLED display may exhibit properties such as low power consumption, high luminance, and high response speed. For these reasons, and others, the OLED has drawn attention as a next generation display device.

The OLED may generally include a hole injection electrode, an organic light emitting layer, and an electron injection electrode. A hole injected from the hole injection electrode and an electron injected from the electron injection electrode are combined to form an exciton, and the OLED may emit light by energy generated when the exciton falls from an excited state to a ground state.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an OLED display having an improved viewing angle and light efficiency.

Additional aspects will be set forth in the detailed description which follows, and, in part, will be apparent from the disclosure, or may be learned by practice of the inventive concept.

An exemplary embodiment of the present invention discloses an OLED display, including a first substrate, a first electrode on the first substrate, a pixel defining layer having a first aperture exposing the first electrode, an organic light emitting layer on the first electrode, a second electrode on the organic light emitting layer, a second substrate disposed to face the first substrate, a black matrix disposed on the second substrate and having a second aperture, and a lens dispsoed to cover at least a part of the second aperture and protruding toward the first substrate.

An exemplary embodiment of the present invention also discloses an OLED display, including a first substrate, a first electrode on the first substrate, a pixel defining layer having a first aperture exposing the first electrode, an organic light emitting layer on the first electrode, a second electrode on the organic light emitting layer, a second substrate disposed to face the first substrate, a black matrix disposed on the second substrate and having a second aperture, a first lens dispsoed to cover at least a part of the first aperture and protruding toward the second substrate, and a second lens dispsoed to cover at least a part of the second aperture and protruding toward the first substrate.

Exemplary embodiments of the present invention provide an OLED display may have an improved viewing angle and light efficiency, and decreased color distortion.

Exemplary embodiments of present invention also provide an OLED display having reduced ambient light reflection without using a separate polarizer.

The foregoing is illustrative only and is not intended to be in any way limiting. In addition to the illustrative aspects, embodiments, and features described above, further aspects, embodiments, and features will become apparent by reference to the drawings and the following detailed description.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
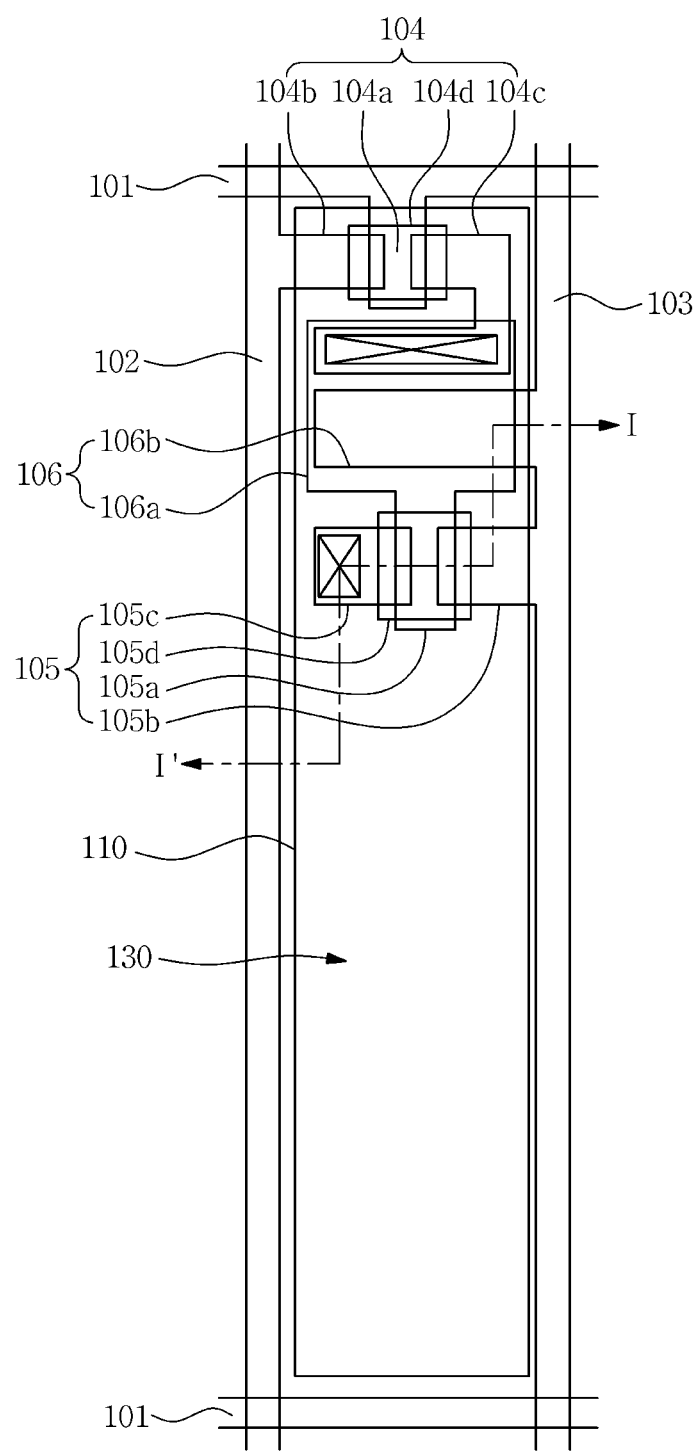
FIG. 1 is a plan view illustrating an OLED display according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, in the OLED display according to an exemplary embodiment of the present invention, a plurality of pixel regions are each defined by a gate line 101 disposed along one direction and data and common power lines 102 and 103, respectively, insulated from and intersecting the gate line 101. One pixel may be disposed in each pixel region, but is not limited thereto. In some embodiments, each pixel region may be defined by the pixel defining layer described below and a plurality of pixels may be disposed in each pixel region.

In the OLED display according to an exemplary embodiment of the present invention, a pixel may have a 2TFT-1Cap structure, including two thin film transistors (TFTs): switching TFT 104 and driving TFT 105; and a capacitor (CAP) 106, but exemplary embodiments of the present invention are not limited thereto. In some embodiments, one pixel may include three or more TFTs and/or two or more capacitors.

The switching TFT 104 may select a pixel to emit light. The switching TFT 104 may include a switching gate electrode 104a connected to the gate line 101, a switching source electrode 104b connected to the data line 102, a switching drain electrode 104c connected to the first capacitor plate 106a, and a switching semiconductor layer 104d.

The driving TFT 105 may provide a driving power, which allows an organic light emitting layer 130 in a pixel selected by the switching TFT 104 to emit light. The driving TFT 105 may include a driving gate electrode 105a connected to the first capacitor plate 106a, a driving source electrode 105b connected to the common power line 103, a driving drain electrode 105c connected to the first electrode 110, and a driving semiconductor layer 105d.

The capacitor 106 may include first and second capacitor plates 106a and 106b. The first capacitor plate 106a may be connected to the switching drain electrode 104c and the driving gate electrode 105a. The second capacitor plate 106b may be connected to the common power line 103. Capacitance of the capacitor 106 may be determined by electric charges stored in the capacitor 106 and a voltage across the first and second capacitor plates 106a and 106b.

Voltage equivalent to a difference between a data voltage applied from the switching TFT 104 and a common voltage applied from the common power line 103 to the driving TFT 105 may be stored in the capacitor 106. Current corresponding to the voltage stored in the capacitor 106 may flow to the organic light emitting layer 130 through the driving TFT 105, so that the organic light emitting layer 130 may emit light.

Figure 2:
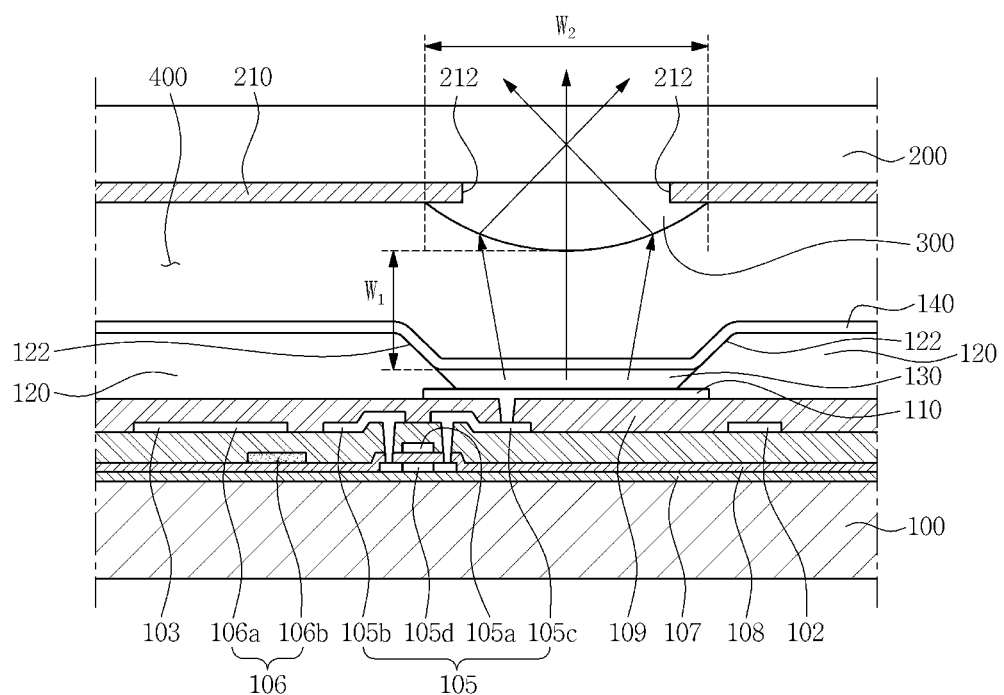
FIG. 2 is a first cross-sectional view taken along line I-I' of FIG. 1 according to an exemplary embodiment of the present invention.

Referring to FIG. 2, an OLED display according to an exemplary embodiment of the present invention may include a first substrate 100, a first electrode 110 disposed on the first substrate 100, a pixel defining layer 120 including a first aperture 122 that exposes the first electrode 110, organic light emitting layer 130 disposed on the first electrode 110, a second electrode 140 disposed on the organic light emitting layer 130, a second substrate 200 facing the first substrate 100, black matrix 210 disposed on the second substrate 200 and including a second aperture 212, and a lens 300 covering at least a part of the second aperture 212 and protruding toward the first substrate 100.

The first substrate 100 may be made of an insulating material selected from a group of glass, quartz, ceramic, plastic and the like, but is not limited thereto. For example, the first substrate 100 may be made of a metal material such as stainless steel, etc.

A buffer layer 107 may include an organic or inorganic layer and may be disposed on the first substrate 100. The buffer layer 107 may reduce or prevent infiltration of detrimental elements such as impurities or moisture and may planarize a surface of the first substrate 100. Further, a gate insulating layer 108 may be disposed on the first substrate 100 between the gate electrodes 104a and 105a and semiconductor layers 104d and 105d, and between the first and second capacitor plates 106a and 106b. An interlayer insulating layer 109 may be disposed between the thin film transistor and the first electrode 110.

The first electrode 110, the organic light emitting layer 130, and the second electrode 140 may be sequentially laminated on the first substrate 100. The first electrode 110 may be an anode that may facilitate hole injection, and the second electrode 140 may be a cathode that may facilitate electron injection. However, exemplary embodiments of the present invention are not limited thereto. For example, the first electrode may be a cathode and the second electrode may be an anode.

At least one of a hole injection layer (not illustrated) and a hole transporting layer (not illustrated) may be disposed between the first electrode 110 and the organic light emitting layer 130. At least one of an electron transporting layer (not illustrated) and an electron injection layer (not illustrated) may be disposed between the second electrode 140 and the organic light emitting layer 130. A thin film encapsulation layer (not illustrated) may be further disposed on the second electrode 140 and may have a structure in which at least one organic layer and at least one inorganic layer may be alternately disposed.

The pixel defining layer 120 may have a first aperture 122 and the first electrode 110 may be exposed by the first aperture 122. That is, the first electrode 110, the organic light emitting layer 130, and the second electrode 140 may be sequentially laminated in the first aperture 122 of the pixel defining layer 120. The organic light emitting layer 130 and the second electrode 140 may be disposed on the pixel defining layer 120.

According to an exemplary embodiment of the present invention, the organic light emitting display device may be a top emission type. That is, the first electrode 110 may be formed of a reflective material and the second electrode 140 may be formed of a transflective material. Light generated from the organic light emitting layer 130 may be emitted on the second substrate 200 through the second electrode 140.

The reflective layer and the transflective layer may include one or more metal, such as magnesium (Mg), silver (Ag), gold (Au), calcium (Ca), lithium (Li), chromium (Cr), and aluminum (Al), or metal alloys thereof. Whether an electrode is a transflective type or a reflective type depends on the thickness of the layer. That is, the transflective electrode has a thickness of about 200 nm or less.

The first electrode 110 may further include a transparent conductive layer formed of a transparent conductive material. The transparent conductive material may include, for example, transparent conductive oxides (TCO) such as indium tin oxide (ITO), indium zinc oxide (IZO), zinc oxide (ZnO) and indium oxide ($In_2O_3$), but is not limited thereto.

The first electrode 110 may include a reflective layer, a double-layer structure including a reflective layer and a transparent conductive layer, or a triple-layer structure where a transparent conductive layer, a reflective layer, and a transparent conductive layer are sequentially laminated, but is not limited thereto. For example, the first electrode may have a structure including a transparent conductive layer.

The second electrode 140 may include a transparent conductive layer. When the second electrode 140 includes a transparent conductive layer, the second electrode 140 may be an anode to facilitate hole injection and the first electrode 110 may be a cathode formed of a reflective material.

The second substrate 200 may be formed of the same material as the first substrate 100 and the black matrix 210 including a second aperture 212 may be disposed on the second substrate 200.

The black matrix 210 may include metal oxides, such as CrO and CrOx, or a black resin, and may absorb ambient light incident on the black matrix 210 through the second substrate 200, thereby reducing ambient light reflection. Thus, the OLED display according to an exemplary embodiment of the present invention may reduce ambient light reflection without using a separate polarizer.

The second aperture 212 may be formed facing the first aperture 122 and light emitted from the organic light emitting layer 130 may radiate on the second substrate 200 through the second aperture 212. The second aperture 212 may be smaller than the first aperture 122. Thus, the second aperture 212 may be about 0.5% to 50% of the size of the first aperture 122.

The lens 300 may be configured to collect light emitted from the organic light emitting layer 130 to the second aperture 212. Both end portions of the lens 300 may overlap the black matrix 210 so that the lens 300 may completely cover the second aperture 212, but the structure is not limited thereto. For example, the lens 300 may be disposed to only partly cover the second aperture 212 and/or may be provided in plural.

The lens 300 may have a refractive index of about 1.4 to 2.0. The lens may be an acrylic lens including acrylic derivatives or a high refractive index lens including high refractive index nanoparticles. However, exemplary embodiments of the present invention are not limited thereto, and thus the lens may be properly modified to include a variety of materials having a refractive index of about 1.4 to 2.0.

The lens 300 may include variety of materials and structures according to a refractive index of a layer disposed in a space between the first and second substrates 100 and 200. Further, a curvature of the lens 300 may vary according to a distance from the organic light emitting layer 130, a size of the organic light emitting layer 130, and other factors.

A distance $W_1$ between the lens 300 and the organic light emitting layer 130 may be about 1 μm to about 50 μm, considering light collecting efficiency. Further, a width $W_2$ of the lens 300 may be smaller than a width of the first aperture 122.

The OLED display illustrated in FIG. 2 may include an air layer 400 in the space between the first and second substrates 100 and 200. The air layer 400 may have a lower refractive index than the lens 300. Therefore, the lens 300 may have a convex structure extending toward the first substrate 100.

Figure 3:
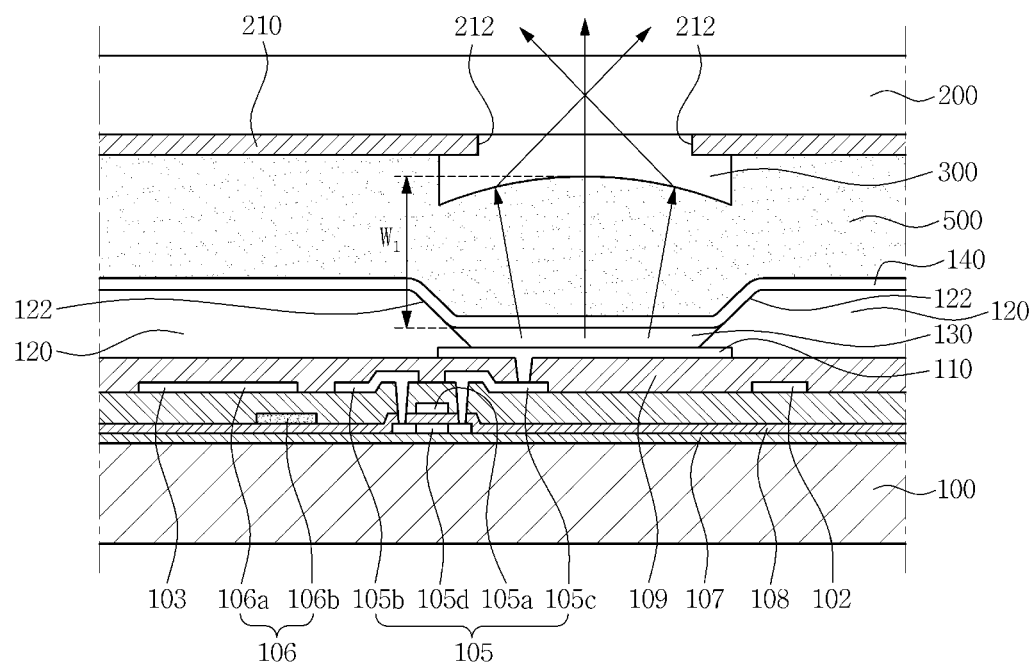
FIG. 3 is a second cross-sectional view taken along line I-I' of FIG. 1 according to an exemplary embodiment of the present invention.

Referring to FIG. 3, an OLED display according to an exemplary embodiment of the present invention may have substantially the same configuration as the OLED display illustrated in FIG. 2, except that a lens 300 has a different structure and a filler 500 is disposed in a space between the first and second substrates 100 and 200. The repeated description will not be provided for sake of brevity.

The filler 500 may include an organic or inorganic material having a refractive index of about 1.1 to about 1.6. The organic material may include acrylics, polyimides, polyamides, poly(methyl methacrylate) (PMMA), and combinations thereof, but is not limited thereto. For example, the filler 500 may include various kinds of organic or inorganic materials having a refractive index of about 1.1 to about 1.6.

The OLED display illustrated in FIG. 3 may include a filler 500 having a refractive index of about 1.4 to about 1.6 disposed in a space between the first and second substrates 100 and 200. The filler 500 may have a higher refractive index than the lens 300. Therefore, the lens 300 may have a concave structure extending towards the first substrate 100, but is not limited thereto. For example, in a case when the filler 500 has a refractive index of about 1.1 to 1.4, the lens 300 may have a convex form extending toward the first substrate 100.

Figure 4:
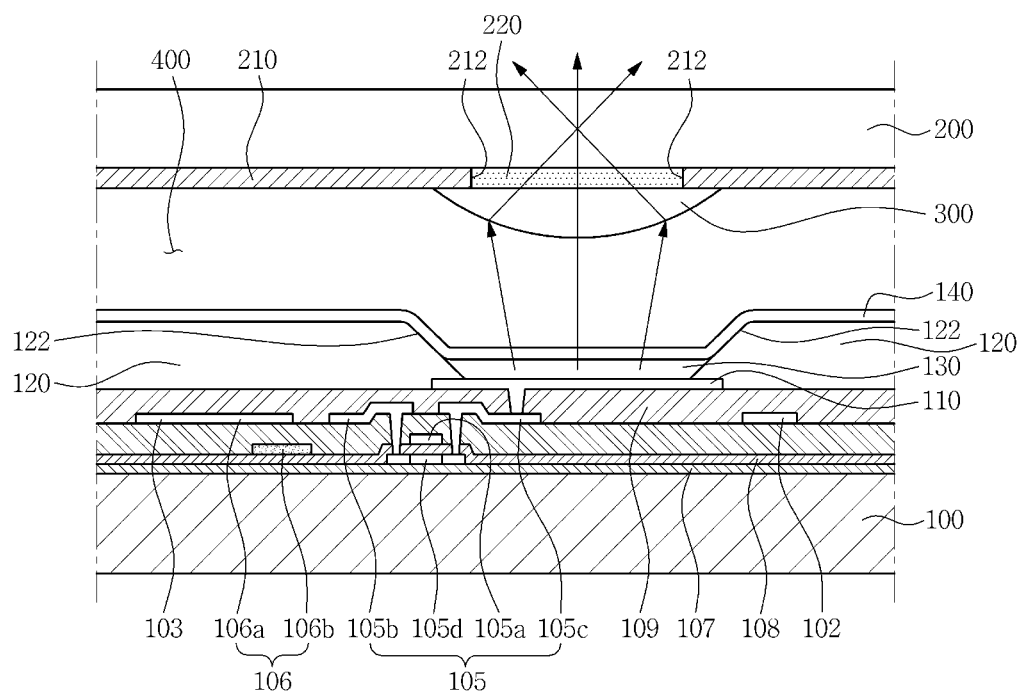
FIG. 4 is a third cross-sectional view taken along line I-I' of FIG. 1 according to an exemplary embodiment of the present invention.

Referring to FIG. 4, the OLED display according to an exemplary embodiment of the present invention may have substantially the same configuration as the OLED display illustrated in FIG. 2, except for a color filter 220. Thus, the repeated description will not be provided for sake of brevity.

The color filter 220 may be disposed in the second aperture 212 and may be one of red, green, and blue. The color filter 220 may, along with the black matrix 210, reduce ambient light reflection. That is, the second substrate 200 may transmit light having a predetermined wavelength range in accordance with each corresponding pixel and may block light having other wavelength range, thereby reducing reflection of ambient light incident on the color filter 220 through the second substrate 200. Therefore, the OLED display according to an exemplary embodiment of the present invention may reduce ambient light reflection without using a separate polarizer.

Figure 5:
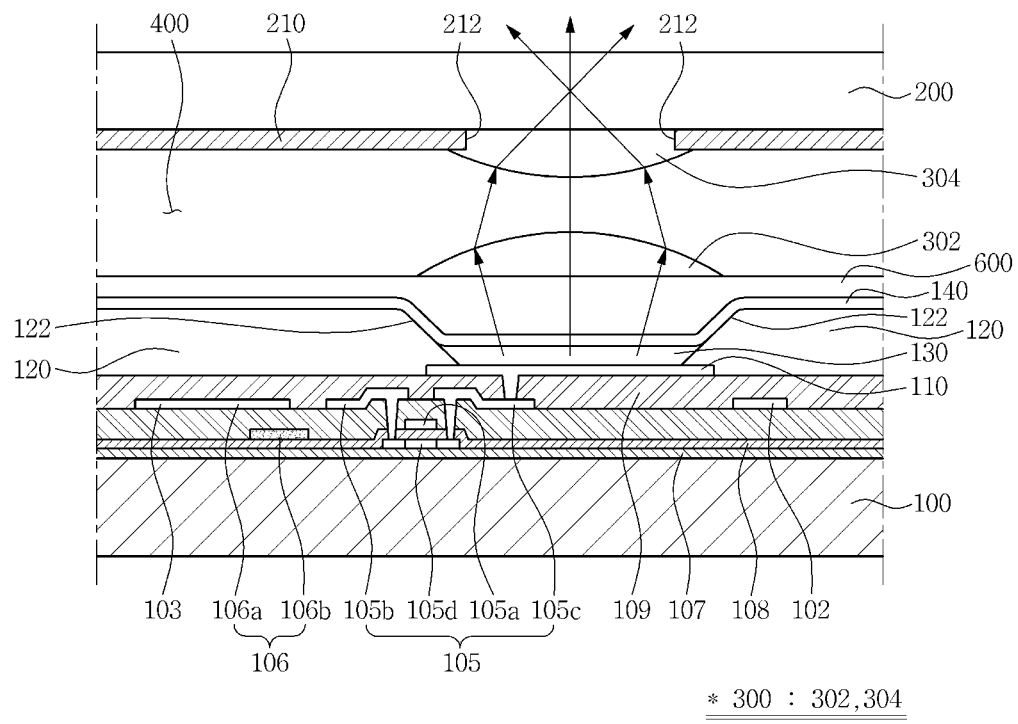
FIG. 5 is a first cross-sectional view taken along line I-I' of FIG. 1 according to another exemplary embodiment of the present invention.

Referring to FIG. 5, the OLED display according to an exemplary embodiment of the present invention may have substantially the same configuration as the OLED display illustrated in FIG. 2, except for a plurality of lenses 302 and 304 and a thin film encapsulation layer 600. Thus, the repeated description will not be provided for sake of brevity.

The lens 300 may include a first lens 302 covering at least a part of the first aperture 122 and protruding toward the second substrate 200, and a second lens 304 covering at least a part of the second aperture 212 and protruding toward the first substrate 100.

The thin film encapsulation layer 600 may be disposed on the second electrode 140 and may protect the organic light emitting layer 130. The thin film encapsulation layer 600 may include at least one organic layer and at least one inorganic layer alternately disposed. However, exemplary embodiments of the present invention are not limited thereto. Thus, the thin film encapsulation layer 600 may be not be present.

In the OLED display illustrated in FIG. 5, the first lens 302 may be disposed on the thin film encapsulation layer 600 and may overlap the pixel defining layer 120 at both end portions to completely cover the first aperture 122. Further, both end portions of the second lens 304 may overlap the black matrix 210 to completely cover the second aperture 212.

In the OLED display illustrated in FIG. 5, an air layer 400 may be disposed in a space between the first and second substrates 100 and 200. The air layer 400 may have a lower refractive index than the first and second lenses 302 and 304. Thus, the first lens 302 may have a convex structure extending toward the second substrate 200 and the second lens 304 may have a convex structure extending toward the first substrate 100.

Figure 6:
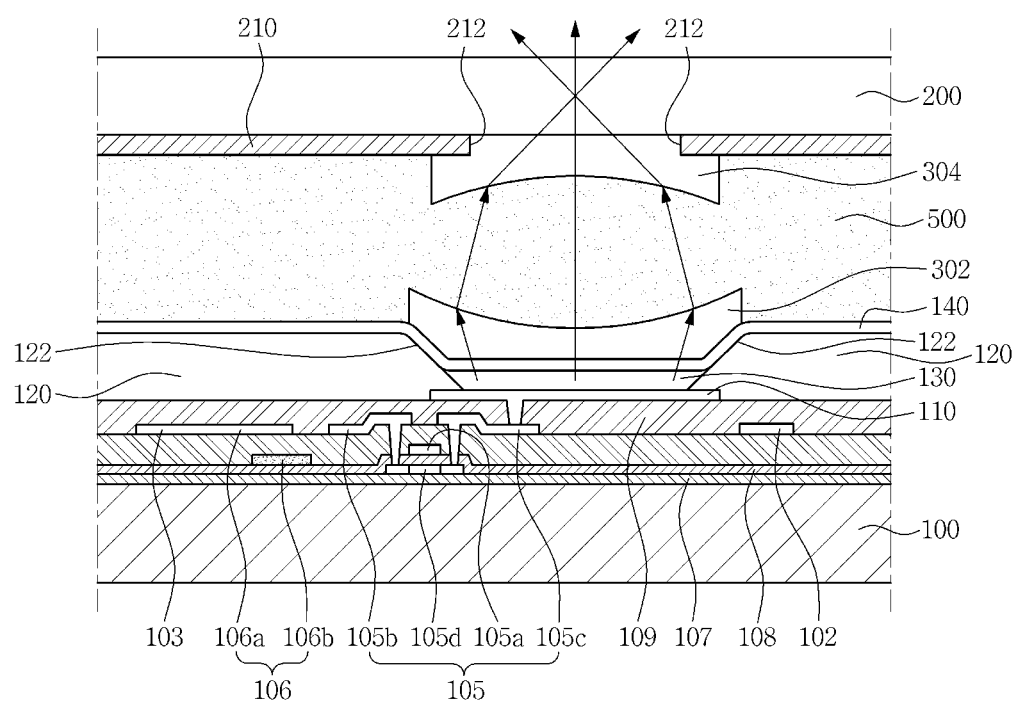
FIG. 6 is a second cross-sectional view taken along line I-I' of FIG. 1 according to another exemplary embodiment of the present invention.

Referring to FIG. 6, an OLED display according to an exemplary embodiment of the present invention may have substantially the same configuration as the OLED display illustrated in FIG. 5, except that the thin film encapsulation layer is not provided, lenses 302 and 304 have a different form, and a filler 500 is disposed in a space between the first and second substrates 100 and 200. Thus, the repeated description will not be provided for sake of brevity.

In the OLED display illustrated in FIG. 6, the filler 500 having a refractive index of about 1.4 to about 1.6 may be disposed in a space between the first and second substrates 100 and 200. The filler 500 may have a higher refractive index than the first and second lenses 302 and 304. The first lens 302 may have a concave structure extending toward the second is substrate 200 and the second lens 304 may have a concave structure extending toward the first substrate 100.

Figure 7:
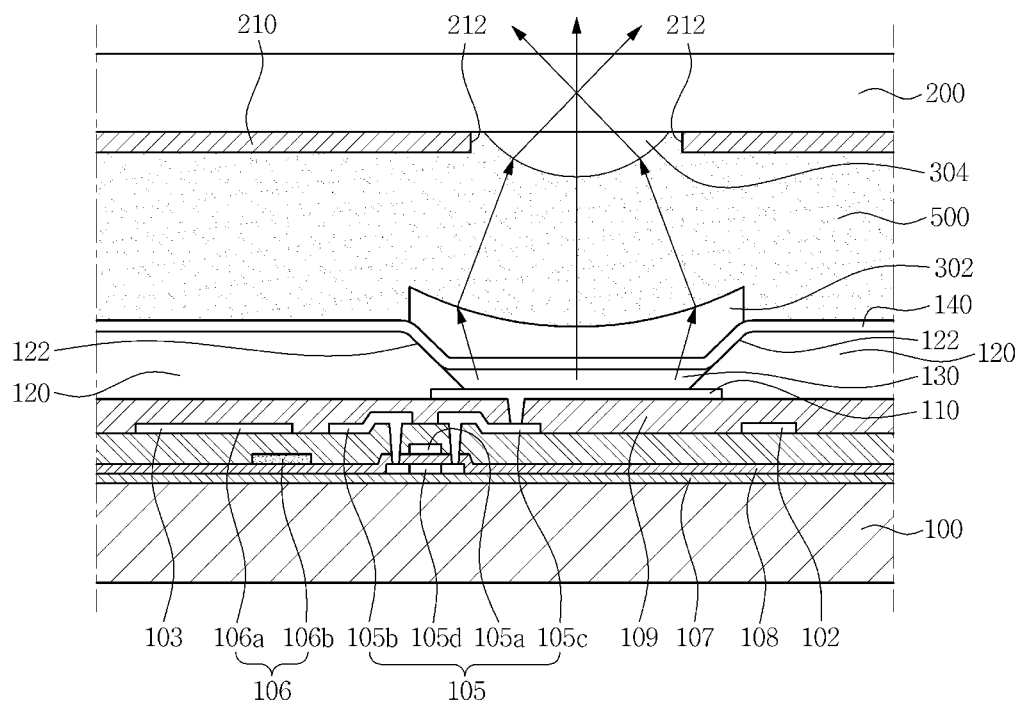
FIG. 7 is a third cross-sectional view taken along line I-I' of FIG. 1 according to another exemplary embodiment of the present invention.

Referring to FIG. 7, an OLED display according to an exemplary embodiment of the present invention may have substantially the same configuration as the OLED display illustrated in FIG. 5, except that the thin film encapsulation layer is not provided, a first lens 302 has a different form, and a filler 500 is disposed in a space between the first and second substrates 100 and 200. Thus, the repeated description will not be provided for sake of brevity.

In the OLED display illustrated in FIG. 7, the filler 500 having a refractive index of about 1.1 to about 1.6 may be disposed in a space between the first and second substrates 100 and 200. The filler 500 may have a refractive index higher than the first lens 302 and lower than the second lens 304. Thus, the first lens 302 may have a concave form extending toward the second substrate 200 and the second lens 304 may have a convex form extending toward the first substrate 100. The second lens 304 may cover at least a part of the second aperture 212.

Figure 8:
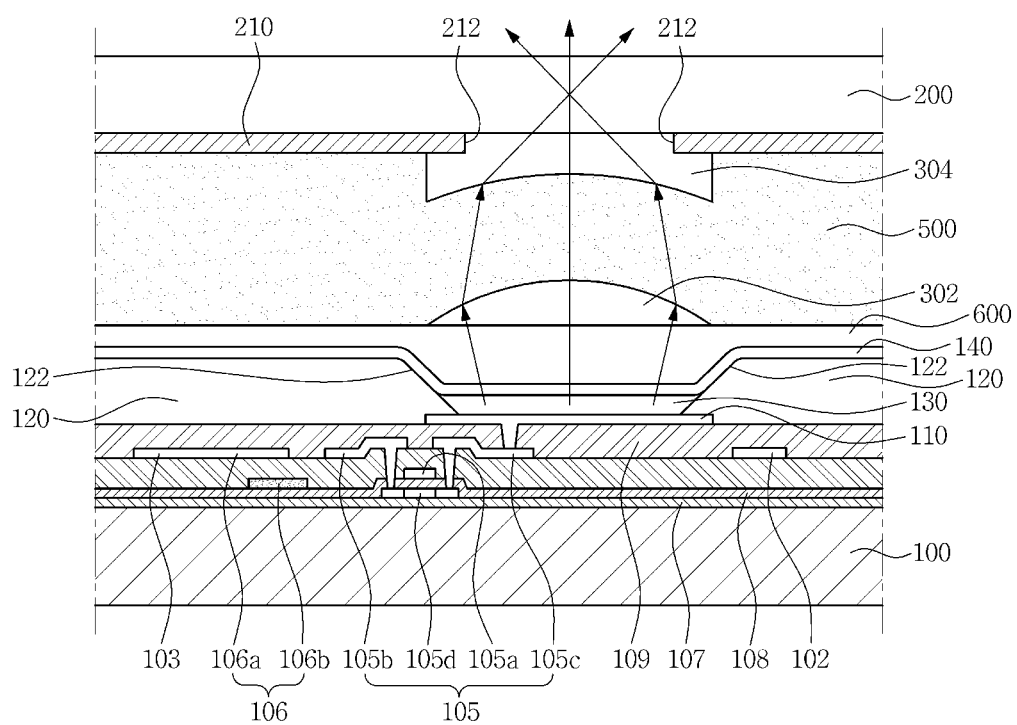
FIG. 8 is a fourth cross-sectional view taken along line I-I' of FIG. 1 according to another exemplary embodiment of the present invention.

Referring to FIG. 8, an OLED display according to an exemplary embodiment of the present invention may have substantially the same configuration as the OLED display illustrated in FIG. 5, except for a second lens 304 provided in a different form and a filler 500 disposed in a space between the first and second substrates 100 and 200. Thus, the repeated description will not be provided for sake of brevity.

In the OLED display illustrated in FIG. 8, the filler 500 having a refractive index of about 1.1 to about 1.6 may be disposed between the first and second substrates 100 and 200. The filler 500 may have a refractive index lower than the first lens 302 and higher than the second lens 304. Therefore, the first lens 302 may have a convex form extending toward the second substrate 200 and the second lens 304 may have a concave form extending toward the first substrate 100.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An OLED display, comprising;
   a first substrate;
   a first electrode disposed on the first substrate;
   a pixel defining layer with a first aperture exposing the first electrode;
   an organic light emitting layer disposed on the first electrode;
   a second electrode disposed on the organic light emitting layer;
   a second substrate;
   a black matrix with a second aperture disposed on the second substrate and facing the second substrate; and
   a lens covering the second aperture and at least a part of the black matrix, the lens protruding toward the first substrate.

2. The OLED display of claim 1, wherein a distance between the lens and the organic light emitting layer is between 1 μm and 50 μm.

3. The OLED display of claim 1, wherein the second aperture has a smaller size than the first aperture.

4. The OLED display of claim 1, further comprising one of a filler and an air layer disposed between the first and second substrates,
   wherein the lens has a higher refractive index than the one of the filler and the air layer.

5. The OLED display of claim 4, wherein the lens has a refractive index between 1.4 and 2.0 and the filler has a refractive index between 1.1 and 1.4.

6. The OLED display of claim 4, wherein a surface of the lens facing the first substrate comprises a convex shape.

7. The OLED display of claim 1, further comprising:
   a filler disposed between the first and second substrates,
   wherein the lens has a lower refractive index than the filler.

8. The OLED display of claim 7, wherein each of the lens and the filler has refractive indices of between 1.4 and 1.6.

9. The OLED display of claim 7, wherein a surface of the lens facing the first substrate has a concave shape.

10. The OLED display of claim 1, further comprising a color filter disposed in the second aperture, wherein the lens covers at least a part of the color filter and the second aperture.

11. An OLED display comprising;
    a first substrate;
    a first electrode on the first substrate;
    a pixel defining layer having a first aperture exposing the first electrode;
    an organic light emitting layer on the first electrode;
    a second electrode on the organic light emitting layer;
    a second substrate disposed to face the first substrate;
    a black matrix disposed on the second substrate and having a second aperture;
    a first lens dispsoed to cover at least a part of the first aperture and protruding toward the second substrate; and
    a second lens covering at least a part of the second aperture and protruding toward the first substrate.

12. The OLED display of claim 11, wherein the second aperture has a smaller size than the first aperture.

13. The OLED display of claim 11, further comprising one of a filler and an air layer disposed between the first and second substrates,
    wherein the first lens and the second lens have higher refractive indices than the one of the filler and the air layer.

14. The OLED display of claim 13, wherein a surface of each of the first lens and the second lens comprises a convex shape.

15. The OLED display of claim 11, further comprising:
    a filler disposed between the first substrate and the second substrate,
    wherein the first lens and the second lens have lower refractive indices than the filler.

16. The OLED display of claim 15, wherein a surface of each the first and second lenses comprises a concave shape.

17. The OLED display of claim 11, further comprising:
    a filler disposed between the first and second substrates,
    wherein the first lens has a different refractive index than the filler, and
    wherein the second lens has a different refractive index than the filler.

18. The OLED display of claim 17, wherein a surface of the first lens has a convex or concave shape, and
    wherein a surface of the second lens has a concave or convex shape.

19. The OLED display of claim 11, further comprising:
    a color filter disposed in the second aperture,
    wherein the second lens covers at least a part of the color filter and part of the the second aperture.

* * * * *